(12) United States Patent
Hsu

(10) Patent No.: US 6,876,084 B2
(45) Date of Patent: Apr. 5, 2005

(54) CHIP PACKAGE STRUCTURE

(75) Inventor: Jimmy Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 340 days.

(21) Appl. No.: 10/065,525

(22) Filed: Oct. 25, 2002

(65) Prior Publication Data

US 2004/0042188 A1 Mar. 4, 2004

(30) Foreign Application Priority Data

Sep. 3, 2002 (TW) .................................... 91213810 U

(51) Int. Cl.⁷ .............................................. H01L 23/48
(52) U.S. Cl. ..................................................... 257/773
(58) Field of Search ................................ 438/689, 676, 438/342, 149, 107; 361/820, 818, 816; 257/786, 778, 773, 734

(56) References Cited

U.S. PATENT DOCUMENTS 5,028,983 A * 7/1991 Bickford et al. ............ 257/668

* cited by examiner

*Primary Examiner*—Evan Pert
*Assistant Examiner*—Monica D. Harrison
(74) *Attorney, Agent, or Firm*—J.C. Patents

(57) ABSTRACT

A chip package structure with a guard circuit design. The individual wires of two pairs of ground wires are positioned on each side of a high frequency signal wire so that external interference is minimized during transmission, multiple ground contacts are provided and current routes are shortened. In the meantime, strength of the electromagnetic field produced by the high frequency signal wire during transmission is limited within the pairs of ground wires. Ultimately, the range of interference by the electromagnetic field, the insertion loss and the return loss are all reduced resulting in improved performance of the chip package.

24 Claims, 9 Drawing Sheets

Table 1
(PRIOR ART)   Table for comparing inserting losses

| Insertion loss (dB) | 2.4GHz | 5GHz |
|---|---|---|
| First type of conventional guard circuit design | −0.128 | −0.371 |
| Second type of conventional guard circuit design | −0.117 | −0.333 |
| Third type of conventional guard circuit design | −0.117 | −0.332 |
| Fourth type of conventional guard circuit design | −0.143 | −0.432 |
| The guard circuit design according to this invention | −0.114 | −0.315 |

Table 2 (PRIOR ART) — Table for comparing return losses

| Return loss (dB) | 2.4GHz | 5GHz |
|---|---|---|
| First type of conventional guard circuit design | −18.26 | −12.22 |
| Second type of conventional guard circuit design | −18.71 | −12.73 |
| Third type of conventional guard circuit design | −18.71 | −12.73 |
| Fourth type of conventional guard circuit design | −17.17 | −11.28 |
| The guard circuit design according to this invention | −19.04 | −13.07 |

CHIP PACKAGE STRUCTURE

CROSS REFERENCE TO RELATED APPLICATIONS

This application claims the priority benefit of Taiwan application serial no. 91213810, filed Sep. 3, 2002.

BACKGROUND OF INVENTION

1. Field of Invention

The present invention relates to a chip package structure. More particularly, the present invention relates to a chip package structure with guard wire protection circuits.

2. Description of Related Art

Following the rapid progress in electronic technologies, many types of electrical appliances are integrated into our every day life. In general, these electrical appliances are driven by one or more integrated circuits (ICs) processed on a die. To protect the fragile die and provide a proper signal communicative channel to external equipment, the die is normally housed inside a package. At present, a variety of packaging techniques classified according to the chip bonding technique are available. The most common bonding techniques include wire bonding (W/B), flip chip (F/C) and tape automatic bonding (TAB). Among the bonding techniques, wire bonding (W/B) has the longest history and is well developed.

For radio frequency (RF) circuits and high-speed circuits, operating frequency and electrical performance considerations often demand the provision of a large ground area in a RF circuit die or a high-speed circuit die. Consequently, chip packages that house an RF circuit die or a high-speed circuit die including the quad flat non-leaded (QFN) and the bump chip carrier (BCC) typically use wire bonding technique to join up with the die.

FIG. 1 is a cross-section view of a conventional quad flat non-leaded package. The chip package 100 mainly includes a carrier 110, a die 120, a plurality of conductive wires 130 and some molding compound 140. The carrier 110 has a die pad 112 and a plurality of electrode bumps 114. The electrode bumps 114 surround the die pad 112. The chip 120 has an active surface 122 and a corresponding back surface 123. The back surface 123 of the die 120 is attached to the die pad 112. In general, the active surface 122 is the surface on the die 120 where active devices are processed and bonding pads 124 are positioned. Furthermore, the two ends of a portion of the conductive wires 130 are connected to a corresponding bonding pad 124 and a contact 118 on the upper surface of the electrode bump 114 respectively. Similarly, the two ends of another portion of the conductive wires 130 are connected to a corresponding bonding pad 124 and a contact 116 on the upper surface of the die pad 112 respectively. The molding compound 140 encapsulates the die 120 and the conductive wires 130 while exposing the bottom surface of the die pad 112 and the electrode bumps 114. Hence, the die 120 is able to connect electrically with external devices through the die pad 112 and the electrode bumps 114. Note that aside from supporting the die 120, the die pad 112 on the carrier 110 also provides a large surface area for ground connection and cooling.

When an RF circuit die or a high-speed circuit die is housed inside a QFN package, a pair of ground wires are often placed on each side of a high frequency signal wire running in a direction parallel to the signal wire direction. This prevents the interference of external signals and narrows down the area vulnerable to electromagnetic field produced by the high frequency signals. In other words, these pairs of ground wires serve as a guard circuit for the high frequency signal wire. FIGS. 2A to 2D are top views of four conventional guard circuit designs. However, none of these designs are able to provide an optimal protection to the high frequency signal wires. The reason for this will be elaborated further in the embodiment below.

SUMMARY OF INVENTION

Accordingly, objectives of the present invention include to provide a chip package structure with a guard circuit design capable of limiting the interference of external signal on signals transmitting within a high frequency signal wire, providing multiple ground connections and a shorter return circuit, narrowing down the area vulnerable to the electromagnetic field produced by the high frequency signals, reducing insertion loss so that high frequency signal can be transmitted with less distortion and minimizing return loss so that reflection due to impedance mismatch is reduced.

To achieve these and other advantages and in accordance with the purpose of the invention, as embodied and broadly described herein, the invention provides a chip package structure. The chip package structure at least includes a carrier, a die, a signal wire, a pair of first non-signal wires and a pair of second non-signal wires. The carrier has a signal contact, a pair of first non-signal contacts and a pair of second non-signal contacts. The signal contact, the pair of first non-signal contacts and the pair of second non-signal contacts are positioned on a surface of the carrier. The second non-signal contacts of the second non-signal contact pair are electrically connected. In addition, the die has an active surface and a corresponding back surface. The back surface of the die is attached to the surface of the carrier. The die further includes a signal pad, a pair of first non-signal pads and a pair of second non-signal pads. The signal pad, the pair of first non-signal pads and the pair of second non-signal pads are positioned on the active surface of the die. The two ends of the signal wire are connected to the signal pad and the signal contact respectively. The two ends of each first non-signal wire in the first non-signal wire pair are connected to one of the pads of the first non-signal pad pair and one of the contacts of the first non-signal contact pair respectively. Furthermore, each first non-signal wire in the first non-signal wire pair is located on each side of the signal wire. The two ends of each second non-signal wire in the second non-signal wire pair are connected to one of the pads of the second non-signal pad pair and one of the contacts of the second non-signal contact pair respectively. Similarly, each second non-signal wire in the second non-signal wire pair is located on one side of the signal wire and the first non-signal wire pair.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
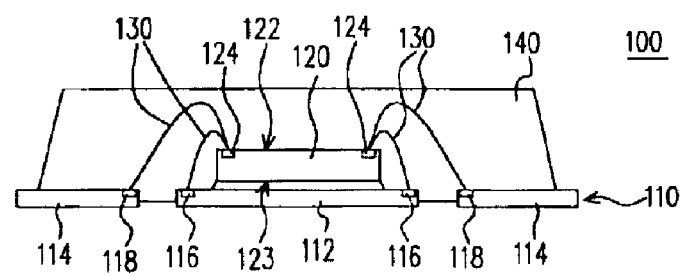
FIG. 1 is a cross-section view of a conventional quad flat non-leaded package.

Table 1 lists the insertion losses at two different operating frequencies for the four types of conventional guard circuit designs as well as the guard circuit design according to this invention; and Table 2 lists the return losses at two different operating frequencies for the four types of conventional guard circuit designs as well as the guard circuit design according to this invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

This invention provides a guard circuit design that can be applied to a quad flat non-leaded (QFN) chip package as shown in FIG. 1. Since the structure of a QFN has been explained before, detailed descriptions are not repeated.

Figure 4:
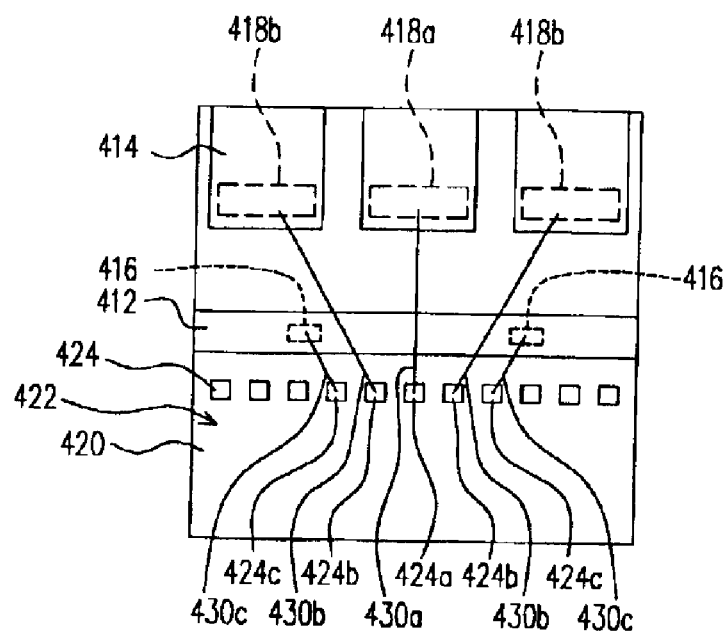
FIG. 4 is a top view of a guard circuit design according to this invention.
Figure 5:
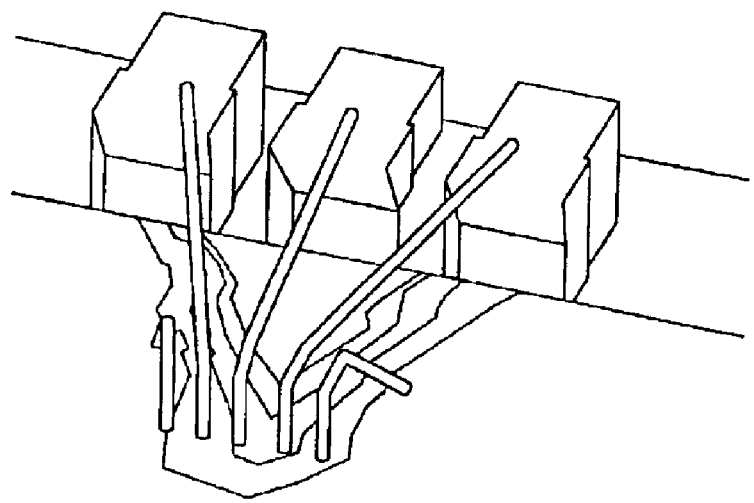
FIG. 5 is a perspective view showing the distribution of electromagnetic field around conductive wires corresponding to the guard circuit design shown in FIG. 4.

FIG. 4 is a top view of a guard circuit design according to this invention. As shown in FIGS. 1 and 4, a die 420 (i.e. the die 120 in FIG. 1) is attached to a die pad 412 (i.e. the die pad 112 in FIG. 1). A wire bonding process is conducted to form a plurality of conductive wires 430. The two ends of each conductive wire 430 (i.e. the conductive wire 130 in FIG. 1) are connected to a bonding pad 424 (i.e. the bonding pad 124 in FIG. 1) on the active surface 422 of the die 420 and the contact 418 (i.e. the contact 118 in FIG. 1) on the upper surface of an electrode bump 414 (i.e. the electrode bump 114 in FIG. 1) respectively. In particular, the two ends of the signal wire 430a are connected to the signal pad 424a and the signal contact 418a respectively.

According to the embodiment of this invention, the guard circuit design includes positioning the respective ground wire of a first ground wire pair 430b on each side of the signal wire 430a. Similarly, the respective ground wire of another ground wire pair 430c is positioned on each side of the signal wire 430a and first ground wire pair 430b. Note that the two ends of each ground wire in the ground wire pair 430b are connected to one of the ground pads of the ground pad pair 424b and one of the ground contacts of the ground contact pair 418b. The two ends of each ground wire in the ground wire pair 430c are connected to one of the ground pads of the ground pad pair 424c and one of the ground contacts of the ground contact pair 416. The ground contact pair 416 is on the upper surface of the die pad 412.

As shown in FIG. 4, the guard circuit design includes positioning the respective ground wire of a first ground wire pair 430b on each side of the signal wire 430a and similarly positioning the respective ground wire of another ground wire pair 430c on each side of the signal wire 430a and first ground wire pair 430b. The ground wire pair 430c also connects the ground pads 424c on the die 420 with the ground pads 416 on the upper surface of the die pad 412. Hence, external signals are prevented from interfering with the high frequency signals transmitted within the signal wire 430a. Furthermore, the signal wire 430a may utilize the nearby high-arcing ground wires 430b as a reference, the inner ground wire pair 430b and the outer ground wire pair 430c to provide multiple ground contacts and the ground wire pair 430c to provide a shorter return circuit. In addition, the electromagnetic field produced by the signal wire 430a during high frequency signal transmission is confined between the inner ground wire pair 430b and the outer ground wire pair 430c. Ultimately, electromagnetic field coverage, insertion loss and return loss due to the transmission of high frequency signals are reduced. Hence, overall post-packaging performance of the die 420 will be improved.

To provide a structural and functional comparison with the four major types of conventional guard circuit designs, each conventional guard circuit design is explained sequentially in the following paragraphs with reference to a diagram and then compared with the guard circuit design according to this invention.

Figure 2A:
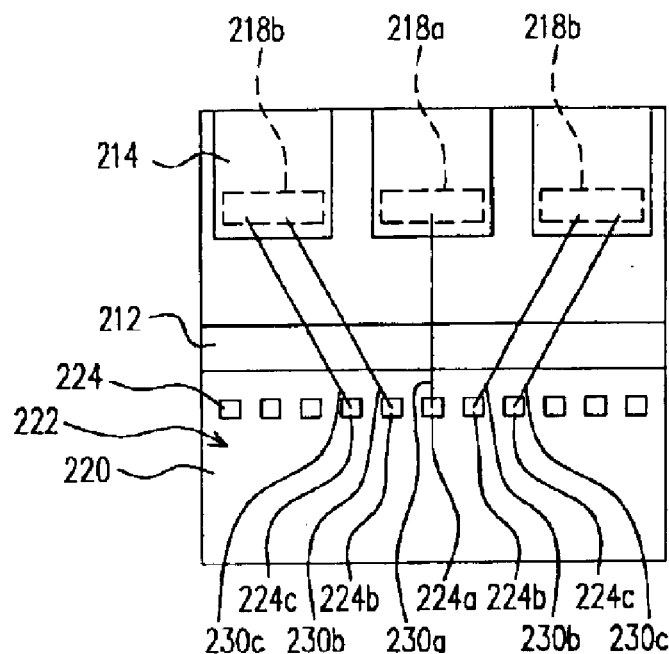
FIGS. 2A to 2D are top views of four conventional guard circuit designs.
Figure 3A:
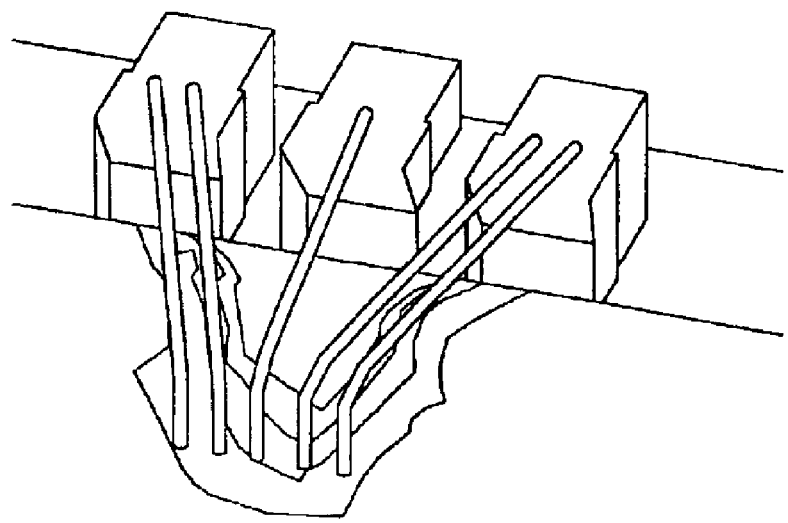
FIGS. 3A to 3D are perspective views showing the distribution of electromagnetic field around conductive wires corresponding to the four guard circuit designs shown in FIGS. 2A to 2D.

FIG. 2A is a top view of a first type of conventional guard circuit design. The guard circuit design includes a ground wire of a ground wire pair 230b on each side of a signal wire 230a and a ground wire of another ground wire pair 230c on each side of the signal wire 230a and the inner ground wire pair 230b. Note that the first type of conventional guard circuit design does not provide a ground wire pair (i.e. the ground wire pair 430c in FIG. 4) to connect the ground pads 224 on the die 220 and the die pad 212. Since a shorter current route is not provided, the design has a larger insertion loss and return loss. Ultimately, there will be greater signal distortion when a high frequency signal passes through the signal wire 230a.

Figure 2B:
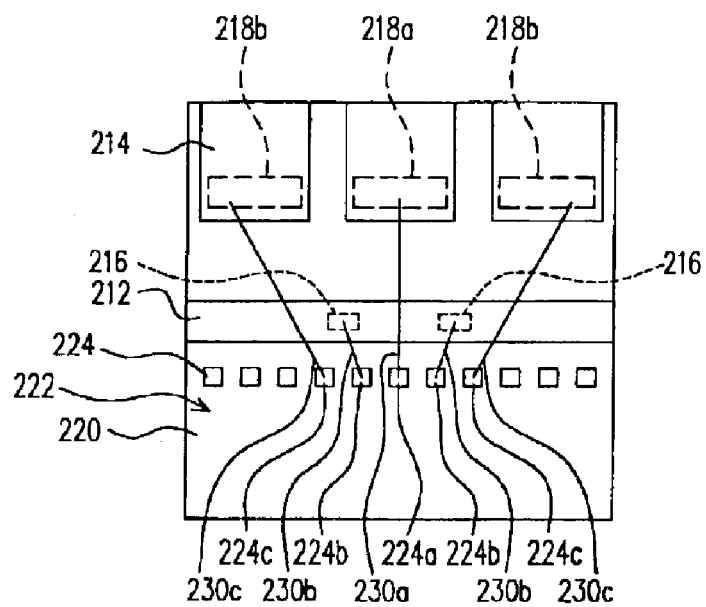
Figure 3B:
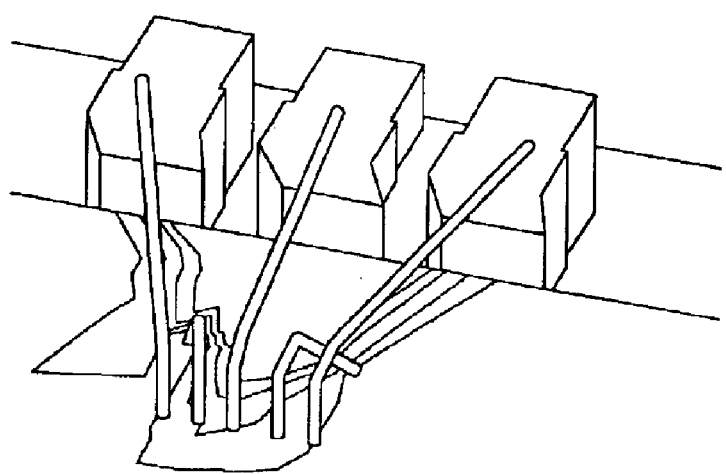

FIG. 2B is a top view of a second type of conventional guard circuit design. The guard circuit design includes a ground wire of a ground wire pair 230b on each side of a signal wire 230a and a ground wire of another ground wire pair 230c on each side of the signal wire 230a and the inner ground wire pair 230b. Note that although the second type of conventional guard circuit design provides a pair of ground wires 230b to connect the ground pads 224 on the die 220 and the die pad 212, the ground wire pair 230c is positioned further away from the signal wire 230a. Consequently, strength of the electromagnetic field produced by high frequency signal transmission inside the signal wire 230a will increase and hence influence a larger area as shown in FIG. 3B.

Figure 2C:
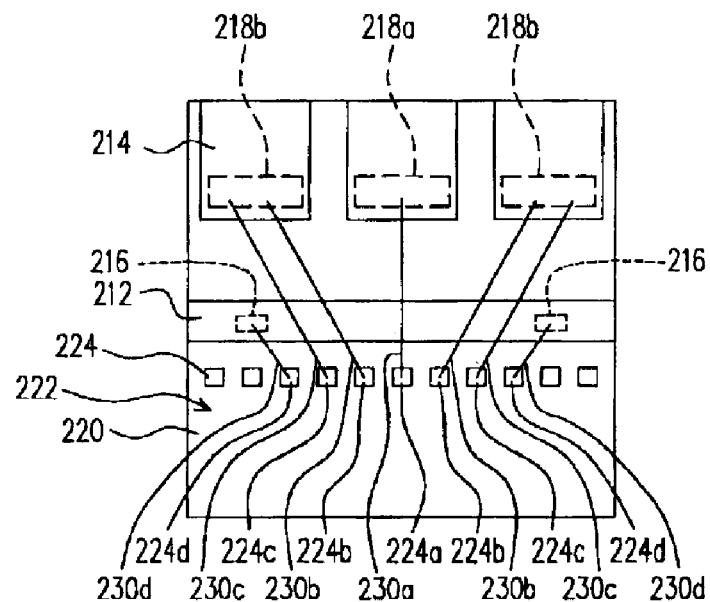
Figure 3C:
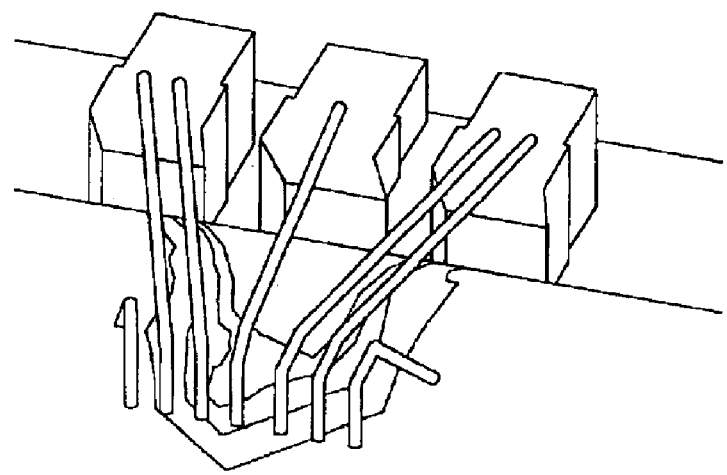

FIG. 2C is a top view of a third type of conventional guard circuit design. The guard circuit design includes a ground wire of a ground wire pair 230b on each side of a signal wire 230a and a ground wire of another ground wire pair 230c on each side of the signal wire 230a and the inner ground wire pair 230b. Furthermore, a ground wire 230d of a third ground wire pair 230d is positioned on each side of the aforementioned signal wire and ground wire pairs. Note that the current flows out of the die 220 to the exterior through two ground wire pairs 230b and 230c before the current reverses back to the die 220 via the die pad 212 and the third ground wire pair 230d. Because the two ground wire pairs 230b and 230c have a total cross sectional area greater than the third ground wire pair 230d, a portion of the current may reverse back to the die 220 via the ground wires 230b or the ground wires 230c. Ultimately, capacity of the ground wire pair 230b for protecting the signal wire 230a is lowered.

Figure 2D:
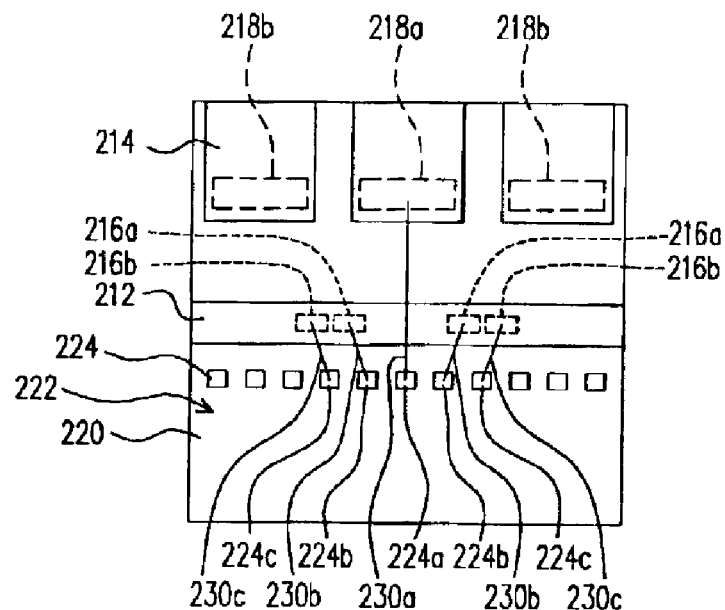
Figure 3D:
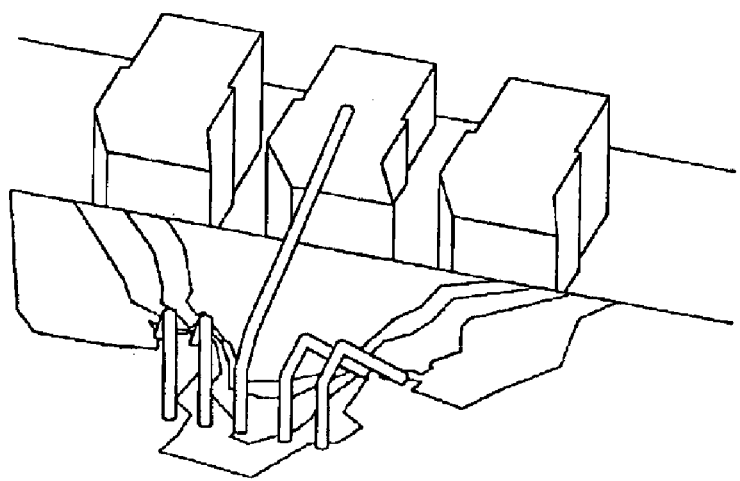

FIG. 2D is a top view of a fourth type of conventional guard circuit design. The guard circuit design includes a ground wire of a ground wire pair 230b on each side of a signal wire 230a and a ground wire of another ground wire pair 230c on each side of the signal wire 230a and the inner ground wire pair 230b. Note that the fourth type of conventional guard circuit design does not provide a ground wire pair (i.e. the ground wire pair 430b in FIG. 4) but is simply positioned on each side of the signal wire 230a. Consequently, strength of the electromagnetic field produced by high frequency signal transmission inside the signal wire 230a will increase and hence influence a larger area as shown in FIG. 3D.

To compare the insertion loss and return loss between the four types of conventional guard circuit designs and the one according to this invention at different operating frequencies, FIG. 6 and Table 1 are reference in the following description.

Figure 6:
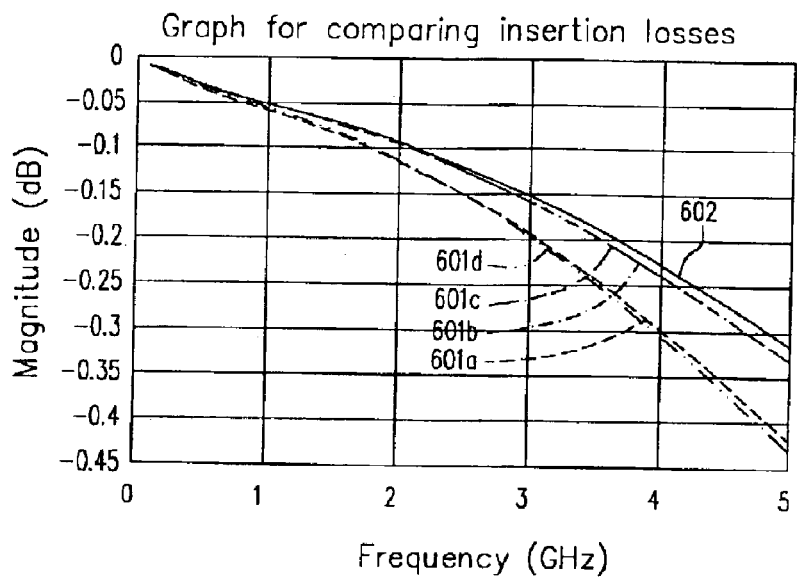
FIG. 6 is a graph showing the variation of insertion loss with operating frequency for the four types of conventional guard circuit designs as shown in FIGS. 2A to 2D.

FIG. 6 is a graph showing the variation of insertion loss with operating frequency for the four types of conventional guard circuit designs as shown in FIGS. 2A to 2D. Table 1 lists out the insertion losses at two different operating frequencies for the four types of conventional guard circuit designs as well as the guard circuit design according to this invention. As shown in FIG. 6, the vertical axis indicates the magnitude of insertion loss while the horizontal axis indicates the operating frequency of the die. Insertion loss of the four types of conventional guard circuit designs with respect to frequency are shown by curves 601a, 601b, 601c and 601d respectively. Insertion loss for the guard circuit design of this invention with respect to frequency is shown by curve 602. Note that energy loss of high frequency signal is reduced when the insertion loss is reduced. Hence, the lowering of insertion loss leads to a smaller distortion of high frequency signals during transmission.

As shown in FIG. 6 and Table 1, the magnitudes of insertion loss for the four types of conventional guard circuit designs when the die is operating at a frequency of 2.4 GHz are found from the curves 601a, 601b, 601c and 601d to be 0.128 dB (decibel), −0.117 dB, −0.117 dB and −0.143 dB respectively. Meanwhile, the magnitude of insertion loss for the guard circuit design according to this invention is found from the curve 602 to be only 0.114 dB, smaller than the value in the conventional designs. Similarly, the magnitudes of insertion loss for the four types of conventional guard circuit designs when the die is operating at a frequency of 5 GHz are found from the curves 601a, 601b, 601c and 601d to be 0.371 dB, −0.333 dB, −0.332 dB and −0.432 dB respectively. Meanwhile, the magnitude of insertion loss for the guard circuit design according to this invention is found from the curve 602 to be only 0.315 dB, again smaller than the value in the conventional designs.

Accordingly, at the same operating frequency, the guard circuit design of this invention produces the smallest magnitude of insertion loss. Hence, this invention has a lower overall energy loss relative to the four conventional designs so that high frequency signals are virtually undistorted after passing through the signal wire.

Figure 7:
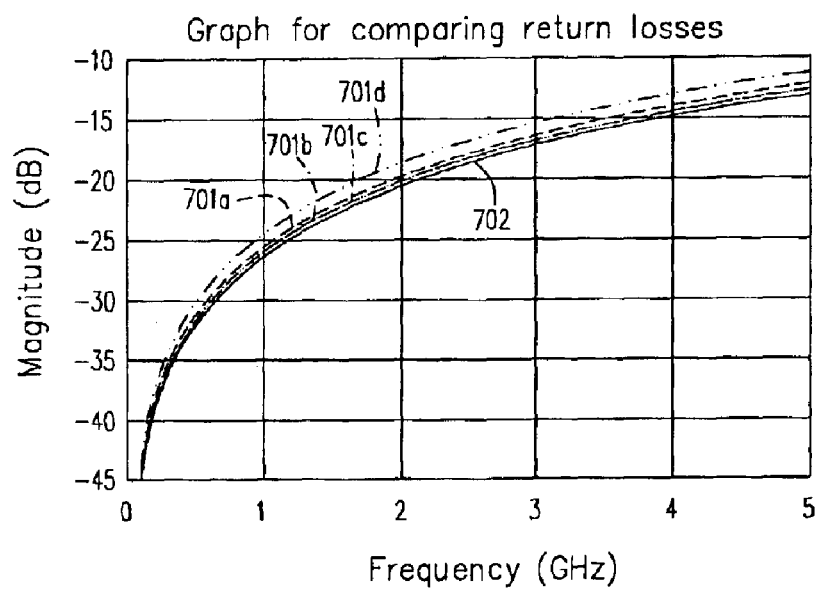
FIG. 7 is a graph showing the variation of return loss with operating frequency for the four types of conventional guard circuit designs as shown in FIGS. 2A to 2D.

FIG. 7 is a graph showing the variation of return loss with operating frequency for the four types of conventional guard circuit designs as shown in FIGS. 2A to 2D. Table 2 lists out the return losses at two different operating frequencies for the four types of conventional guard circuit designs as well as the guard circuit design according to this invention. As shown in FIG. 7, the vertical axis indicates the magnitude of return loss while the horizontal axis indicates the operating frequency of the die. Return loss of the four types of conventional guard circuit designs with respect to frequency are shown by curves 701a, 701b, 701c and 701d respectively. Return loss for the guard circuit design of this invention with respect to frequency is shown by curve 702. Note that reflection due to impedance mismatch of the high frequency signal is reduced when the return loss is reduced.

As shown in FIG. 7 and Table 2, the magnitudes of return loss for the four types of conventional guard circuit designs when the die is operating at a frequency 2.4 GHz are found from the curves 701a, 701b, 701c and 701d to be 18.26 dB, −18.71 dB, −18.71 dB and 17.17 dB respectively. Meanwhile, the magnitude of return loss for the guard circuit design according to this invention is found from the curve 702 to be only 19.04 dB, smaller than the value in the conventional designs. Similarly, the magnitudes of return loss for the four types of conventional guard circuit designs when the die is operating at a frequency 5 GHz are found from the curves 701a, 701b, 701c and 701d to be 12.22 dB, −12.73 dB, −12.73 dB and 11.28B respectively. Meanwhile, the magnitude of return loss for the guard circuit design according to this invention is found from the curve 702 to be only 13.79 dB, again smaller than the value in the conventional designs.

Accordingly, at the same operating frequency, the guard circuit design of this invention produces the smallest magnitude of return loss. Hence, this invention has a lower overall return loss relative to the four conventional designs so that reflection due to impedance mismatch of high frequency signals is greatly reduced.

Figure 8:
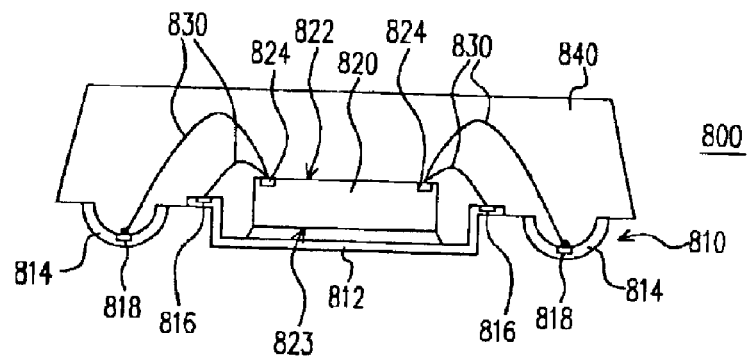
FIG. 8 is a cross-sectional view of a chip package structure having the guard circuit design according to this invention.
Figure 9:
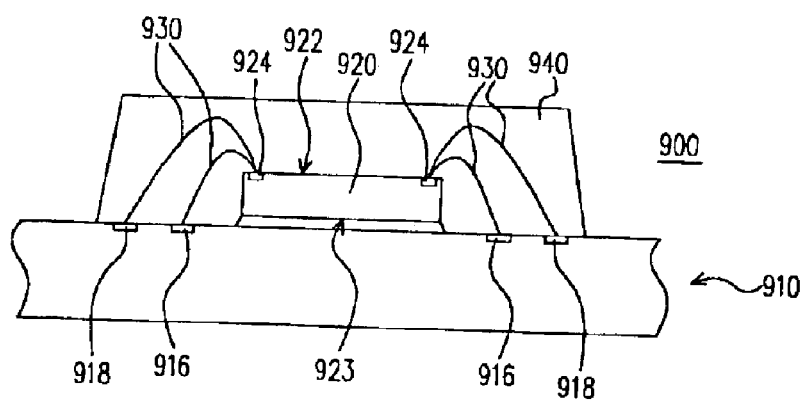
FIG. 9 is a cross-sectional view of an alternative chip package structure having the guard circuit design according to this invention.

Aside from application to a quad flat non-leaded (QFN) chip package, the guard circuit design of this invention can be applied to other types of packages. For example, the guard circuit design of this invention may be applied to a bump chip carrier (BCC) package structure (as shown in FIG. 8). Similarly, the design may be applied to a substrate chip package structure (as shown in FIG. 9) that uses wire bonding processes or other carrier chip packages that similarly use wire bonding processes. The following is a description of the guard circuit design of this invention applied to a BCC chip package and a wire-bond substrate chip package.

FIG. 8 is a cross-sectional view of a chip package structure having the guard circuit design according to this invention. As shown in FIG. 8, the chip package structure 800 is that of a bump chip carrier (BCC). Since the main difference between the chip package structure 800 and the package structure 100 in FIG. 1 lies in the structural difference between the carrier 810 and the carrier 110, the following is a detailed description of the carrier 810 inside the chip package 800. The carrier 810 mainly comprises a die carrier structure 812 and a plurality of cavity conductive structures 814. These cavity conductive structures 814 surround the die carrier structure 812. The die carrier structure 812 is a place for attaching the back surface 823 of a die 820.

The die carrier structure 812 also provides a relatively large area for grounding and a relatively large surface for cooling. The upper surface of the carrier structure 812 further includes a plurality of contacts 816 for connecting with one end of conductive wires 830, similar in function to the contacts 116 in FIG. 1. The interior surface of each cavity conductive structure 814 constitutes a contact 818 for connecting with one end of the conductive wires 830, similar in function to the contacts 118 in FIG. 1. A molding compound 840 encapsulates the die 820 and the conductive wires 830. A portion of the molding compound 840 also fills up the space above the cavity conductive structures 814. Meanwhile, the bottom surface of the die carrier structure 812 and the bottom surface of the cavity conductive structures 814 are exposed through the molding compound 840.

FIG. 9 is a cross-sectional view of an alternative chip package structure having the guard circuit design according to this invention. The chip package structure 900 shown in FIG. 9 mainly comprises a substrate 910, a die 920, a plurality of conductive wires 930 and some molding compound 940. The upper surface of the substrate 910 has a grounding ring (or power ring) 916 that encloses a die 920. The grounding ring (or power ring) 916 also constitutes a multiple of contacts for grounding (or power connection) and has a function similar to the common ground (common power source) provided by the contacts 116 on the die pad 112 in FIG. 1. In addition, the upper surface of the substrate 910 has a plurality of contacts 918 that surrounds the die 920 but is further away from the die 920 when compared with the grounding ring (or power ring) 916. The contacts 918 have a function similar to the contacts 118 in FIG. 1. The back surface 923 of the die 920 is attached to the upper surface of the substrate 910. Hence, the substrate 910 is a carrier for the die 920. The active surface 922 of the die 920 has a plurality of bonding pads 924. Some conductive wires 930 have one end bonded to a bonding pad 924 while the other end is bonded to one of the grounding rings (or power rings) 916. On the other hand, some other conductive wires 930 have one end bonded to a bonding pad 924 while the other end is bonded to a contact 918. The molding compound 940 encapsulates the die 920 and the conductive wires 930.

Note that aside from using ground wire pairs to reduce the influence of the electromagnetic field produced by high frequency signal transmission, power wire pairs instead of ground wire pairs may be used to achieve the same effect. To introduce the power wire pairs, the ground pads are changed to power pads and ground contacts are changed to power contacts. In other words, the guard circuit design according to this invention uses two pairs of non-signal wires (ground wire pairs or power wire pairs) positioned on each side of a signal wire. In addition, the high frequency signal referred to in this invention is an operating signal frequency exceeding 500 MHz. The high frequency signal may include, for example, clocking signals, reference signals or other types of functional signals.

In summary, the guard circuit design according to this invention is mainly applied to a chip package structure with a wire-bonded carrier. A first pair of ground wires are positioned on each side of a signal wire and a second pair of ground wires are next positioned on each side of the signal wire and the first ground wire pair. Therefore, two ground wire pairs are set up around the signal wire to prevent any external interference during high frequency signal transmission. Furthermore, the two neighboring high-arching ground wires may be used as a reference for the signal wire. Since the two ends of each ground wire pair are connected to the ground pad of the die and the ground contact on the upper surface of the carrier, a multiple of grounding contacts are provided and the current routes are shortened. In addition, the guard circuit design of this invention is further capable of limiting the electromagnetic field produced by the high frequency signal wire to within the two ground wire pairs. Hence, the extent of influence by the electromagnetic field, the insertion loss and the return loss for operating at a high frequency are all reduced. In fact, electrical performance of the die inside the package improves so much over the conventional guard circuit designs that signal distortion after passing a high frequency signal through the signal wire is largely eliminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising: a carrier having at least one signal contact, a pair of first non-signal contacts and a pair of second non-signal contacts, wherein the signal contact, the pair of first non-signal contacts and the pair of second non-signal contacts are positioned on the surface of the carrier, and the second non-signal contacts are electrically connected to each other; a die having an active surface and a corresponding back surface, wherein the back surface of the die is attached to one surface of the carrier, the die further includes a signal pad, a pair of first non-signal pads and a pair of second non-signal pads, the signal pad, the pair of first non-signal pads and the pair of second non-signal pads are positioned on the active surface of the die, and furthermore, the pair of second non-signal contacts is closer to the die than the signal contact or the pair of first non-signal contacts; a signal wire whose ends are connected to the signal pad and the signal contact respectively; a pair of first non-signal wires, wherein the two ends of each first non-signal wire are connected to one of the first non-signal pads and one of the first non-signal contacts respectively, and the first non-signal wires of the first non-signal wire pair are on each side of the signal wire; and a pair of second non-signal wires, wherein the two ends of the each second non-signal wire are connected to one of the second non-signal pads and one of the second non-signal contacts respectively, and the second non-signal wires of the second non-signal wire pair are on each side of the signal wire and first non-signal wire pair assembly.

2. The chip package structure of claim 1, wherein the package further includes a molding compound that encapsulates the die, the signal wire, the pair of first non-signal wires and the pair of second non-signal wires.

3. The chip package structure of claim 1, wherein the pair of first non-signal contacts are ground contacts, the pair of first non-signal pads are ground pads and the pair of first non-signal wires are ground wires.

4. The chip package structure of claim 1, wherein the pair of first non-signal contacts are power contacts, the pair of first non-signal pads are power pads and the pair of first non-signal wires are power wires.

5. The chip package structure of claim 1, wherein the pair of second non-signal contacts are ground contacts, the pair of second non-signal pads are ground pads and the pair of second non-signal wires are ground wires.

6. The chip package structure of claim 5, wherein the carrier further includes a ground ring on the surface of the carrier and a portion of the ground ring constitutes the pair of second non-signal contacts.

7. The chip package structure of claim 1, wherein the pair of second non-signal contacts are power contacts, the pair of second non-signal pads are power pads and the pair of second non-signal wires are power wires.

8. The chip package structure of claim 7, wherein the carrier further includes a power ring on the surface of the carrier and a portion of the power ring constitutes the pair of second non-signal contacts.

9. The chip package structure of claim 1, wherein the carrier further includes a die pad and a plurality of electrode bumps, the electrode bumps surround the die pad, the die is attached to the upper surface of the die pad, the upper surface of the die pad constitutes the second non-signal contacts and the upper surface of a portion of the electrode bumps constitutes the signal contact and the pair of first non-signal contacts respectively.

10. The chip package structure of claim 9, wherein the package further includes a molding compound that encapsulates the die, the signal wire, the pair of first non-signal wires and the pair of second non-signal wires.

11. The chip package structure of claim 1, wherein the carrier further includes a chip carrier structure and a plurality of cavity conductive structures surrounding the chip carrier structure, the die is attached to the upper surface of the chip carrier structure, the upper surface of the chip carrier structure constitutes the second non-signal contacts, and the interior surface of a portion of the cavity conductive structures constitutes the signal contact and the pair of first non-signal contacts.

12. The chip package structure of claim 11, wherein the package further includes a molding compound that encapsulates the die, the signal wire, the pair of first non-signal wires and the pair of second non-signal wires and fills the space enclosed by the interior surface of the cavity conductive structures.

13. A chip package structure, comprising: a carrier having a plurality of first contacts and a plurality of second contacts, wherein the first contacts and the second contacts are positioned on the one surface of the carrier; a die having an active surface and a corresponding back surface, wherein the back surface of the die is attached to the surface of the carrier, the die further includes a plurality of bonding pads all positioned on the active surface of the die, and furthermore, the second contacts are closer to the die than the first contacts; a signal wire whose ends are connected to one of the bonding pads and one of the first contacts respectively; a pair of first non-signal wires, wherein the two ends of each first non-signal wire are connected to one of the bonding pads and one of the first contacts respectively, and the first non-signal wires of the first non-signal wire pair are positioned on each side of the signal wire; and a pair of second non-signal wires, wherein the two ends of the each second non-signal wire are connected to one of the bonding pads and one of second contacts respectively, and the second non-signal wires of the second non-signal wire pair are on each side of the signal wire and first non-signal wire pair assembly.

14. The chip package structure of claim 13, wherein the package further includes a molding compound that encapsulates the die, the signal wire, the pair of first non-signal wires and the pair of second non-signal wires.

15. The chip package structure of claim 13, wherein the pair of first non-signal wires are ground wires.

16. The chip package structure of claim 13, wherein the pair of first non-signal wires are power wires.

17. The chip package structure of claim 13, wherein the pair of second non-signal wires are ground wires.

18. The chip package structure of claim 17, wherein the carrier further includes a ground ring on the surface of the carrier and a portion of the ground ring constitutes the second contacts.

19. The chip package structure of claim 13, wherein the pair of second non-signal wires are power wires.

20. The chip package structure of claim 19, wherein the carrier further includes a power ring on the surface of the carrier and a portion of the power ring constitutes the second contacts.

21. The chip package structure of claim 13, wherein the carrier includes a die and a plurality of electrode bumps that surrounds the die pad, the die is attached to the upper surface of the die pad, the upper surface of the die pad constitutes the second contacts and the upper surface of a portion of the electrode bumps constitutes the first contacts.

22. The chip package structure of claim 21, wherein the package further includes a molding compound that encapsulates the die, the signal wire, the pair of first non-signal wires and the pair of second non-signal wires.

23. The chip package structure of claim 13, wherein the carrier includes a chip carrier structure and a plurality of cavity conductive structures surrounding the chip carrier structure, the die is attached to the upper surface of the chip carrier structure, the upper surface of the chip carrier structure constitutes the second non-signal contacts, and the interior surface of a portion of the cavity conductive structures constitutes the first contacts.

24. The chip package structure of claim 13, wherein the package further includes a molding compound that encapsulates the die, the signal wire, the pair of first non-signal wires and the pair of second non-signal wires and fills the space enclosed by the interior surface of the cavity conductive structures.

* * * * *